(12) United States Patent
Liu et al.

(10) Patent No.: US 11,817,344 B2
(45) Date of Patent: Nov. 14, 2023

(54) METHOD FOR MANUFACTURING SHALLOW TRENCH ISOLATIONS

(71) Applicant: Shanghai Huali Microelectronics Corporation, Shanghai (CN)

(72) Inventors: Liyuan Liu, Shanghai (CN); Li He, Shanghai (CN); Fulong Qiao, Shanghai (CN); Yi Wang, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 215 days.

(21) Appl. No.: 17/493,229

(22) Filed: Oct. 4, 2021

(65) Prior Publication Data
US 2022/0172982 A1    Jun. 2, 2022

(30) Foreign Application Priority Data

Nov. 30, 2020   (CN) .......................... 202011377953.1

(51) Int. Cl.
*H01L 21/762* (2006.01)
*H01L 21/308* (2006.01)
*H01L 21/3213* (2006.01)

(52) U.S. Cl.
CPC .... *H01L 21/76224* (2013.01); *H01L 21/3086* (2013.01); *H01L 21/3088* (2013.01); *H01L 21/32139* (2013.01)

(58) Field of Classification Search
CPC ............. H01L 21/3086; H01L 21/3088; H01L 21/32139; H01L 21/76224–76237
See application file for complete search history.

(56) References Cited

U.S. PATENT DOCUMENTS

| | | | |
|---|---|---|---|
| 10,347,640 B1* | 7/2019 | Tsai | H01L 29/0649 |
| 2007/0275538 A1* | 11/2007 | Ang | H01L 21/76224 |
| | | | 257/E21.546 |
| 2010/0096719 A1* | 4/2010 | Lee | H01L 21/76229 |
| | | | 257/E21.546 |
| 2022/0108997 A1* | 4/2022 | Hekmatshoartabari | |
| | | | H10B 61/00 |

\* cited by examiner

*Primary Examiner* — Walter H Swanson
(74) *Attorney, Agent, or Firm* — Banner & Witcoff, Ltd.

(57) ABSTRACT

The disclosure provides a method for manufacturing shallow trench isolations, providing a substrate comprising a storage cell area and a peripheral area of a storage device; etching the upper part of the substrate of the storage cell area using a first etching process to form a first shallow trench, and filling the first shallow trench with silicon oxide using a first deposition process; and etching the upper part of the substrate of the peripheral area using a second etching process to form a second shallow trench, and filling the second shallow trench with silicon oxide using a second deposition process; wherein the depth and characteristic dimension of the first shallow trench are smaller than the depth and characteristic dimension of the second shallow trench. The disclosure can avoid the silicon dislocation defect of the peripheral area and ensure the device shape and characteristic dimension of the storage cell area.

9 Claims, 8 Drawing Sheets

METHOD FOR MANUFACTURING SHALLOW TRENCH ISOLATIONS

CROSS-REFERENCES TO RELATED APPLICATIONS

This application claims priority to Chinese patent application No. 202011377953.1, filed on Nov. 30, 2020, the disclosure of which is incorporated herein by reference in its entirety.

TECHNICAL FIELD

The present invention relates to the field of manufacturing of semiconductor devices, in particular to a method for manufacturing shallow trench isolations of a storage device.

BACKGROUND

Since doctor Jack Kilby of Texas Instruments invented an integrated circuit in the early days, scientists and engineers have made many inventions and improvements on semiconductor devices and processes. In the past 50 years, the sizes of semiconductors have been significantly reduced, which has led to a growing processing speed and continuously reduced power consumption. So far, the development of semiconductors roughly follows the Moore's law. The Moore's law generally refers to doubling of the number of transistors in integrated circuits about every two years. Now, the semiconductor process is moving towards 20 nm or less. Here is only a reference: a silicon atom is about 0.2 nm, which means that the distance between two independent components produced by the 20 nm process is only about one hundred silicon atoms. The manufacturing of semiconductor devices has thus become increasingly challenging and advanced towards physically possible limits.

Flash memories have the advantages of non-volatility, easy programming and erasion, long service life, low cost and the like, and therefore, have been widely used in various fields, including consumer electronics, network communication equipment, industrial instrumentation embedded systems, automotive devices, etc.

The existing flash memory structure, taking a NAND Flash structure as an example, generally includes a storage cell area and a peripheral area. The storage cell area includes the most basic data storage cell, usually characterized by a storage transistor. The peripheral area includes a logic control cell, which may include a high voltage P-type MOS transistor (HVPMOS), a high voltage N-type MOS transistor (HVNMOS), a low voltage P-type MOS transistor (LVPMOS), a low voltage N-type MOS transistor (LVNMOS), and the like.

For the storage cell area, in order to increase storage density, the 2X Generation node has now been entered as described above, that is, the characteristic dimension of the storage transistor is between 20 and 30 nm. In order to form a storage transistor device in accordance with the characteristic dimension, when photolithography is performed, because of the exposure limit of ArF, a pattern having a final characteristic dimension of 52 nm is formed in the storage cell area of an AA loop by means of SADP technology, and a pattern in the peripheral area is defined during AA photo. Since the storage cell area and the peripheral area are greatly different in characteristic dimension, the ratio of CD of a side space of a low voltage device area of the peripheral area to CD of a side space of the storage cell area is 10:1 or more, and the ratio of CD of a side space of a high voltage device area of the peripheral area to CD of a side space of the storage cell area is 40:1 or more. Under the requirements of these process parameters, it is difficult to control the trench depth/CD/HM remain loading of the storage cell area and the peripheral area, and it is relatively difficult to achieve the trench depth/CD/HM remain target required by the device performance of the storage cell area and the peripheral area after final etch. Meanwhile, the PSZ material filled in a shallow trench isolation trench (STI trench) will cause a dislocation defect of silicon in the peripheral area due to the stress effect.

The problems present in order to form floating gate structures and shallow trench isolations of a storage device in the prior art are interpreted in conjunction with FIGS. 1 and 2. First, as shown in FIG. 1, in order to form a storage device, the film structure of a semiconductor device required to be processed sequentially includes in the height direction of a substrate from bottom to top: a substrate 110, a gate dielectric layer, polysilicon 130, silicon nitride 140, an oxide buffer layer 150, amorphous silicon A-Si 160, and a mask pattern. The gate dielectric layer further includes a gate dielectric layer 121 corresponding to storage cell and low voltage devices in peripheral area and a gate dielectric layer 122 corresponding to high voltage devices in the peripheral area. The mask pattern further includes a side space image 171 based on a self-aligning dual imaging process corresponding to the storage cell and a mask pattern BARC/ODL 172 corresponding to the peripheral devices, that is, a photoresist pattern formed by an ordinary organic dielectric material.

In the prior art, a storage cell floating gate structure 181, a peripheral low voltage device floating gate structure 182, and a peripheral high voltage device floating gate structure 183 are etched at the same time and form a final shallow trench of a shallow trench isolation at the same time, and then the shallow trench is filled with an oxide formed by PSZ. The reaction synthesis process of the oxide formed by the PSZ is, O in Perhydro-Polysilazane (PSZ) is replaced with N using vapor as an oxygen source in an environment of about 300° C., and then a storage cell area STI 191 and a peripheral area STI 192 are formed from $SiO_2$ via an annealing process of 500° C. to 800° C. However, due to the large characteristic dimensions of the mask patterns in the low voltage and high voltage device areas of the peripheral area, after the PSZ oxide is annealed at high temperature, the stress dislocation defect in the peripheral area is severe, as shown in the peripheral area STI 192 in FIG. 2.

Moreover, since the thickness of the gate dielectric layer 122 of the high voltage device in the peripheral area is 400 angstroms or more, it takes a long etching time to completely open the gate dielectric layer 122 in the prior art. Compared to the storage cell area, the gate dielectric layer 121 involves excessive etching, which is very unfriendly to the shape of the device in the storage cell area, specifically:

1) Excessive etching time results in shape damage of the top floating gate structure in
 the storage cell area and loss of oxide as a protective layer at the top of the floating
 gate structure;
2) If etching parameters of a high selection ratio of oxide (the material of the gate
 dielectric layer) to silicon are selected, the taper of the top of the storage cell area STI
 is not conducive to the formation of a vertical trench shape of the storage cell area
 STI;

3) If etching parameters of a low selection ratio of oxide (the material of the gate dielectric layer) to silicon are selected, a vertical shape can be easily formed at the top of the STI, but the shape damage of the floating gate layer above the STI and the loss of oxide at the top are exacerbated;

4) Excessive etching results in a depth difference of trenches in the large open area of the peripheral device and the small open area of the storage cell, which is not conducive to last depth control of trenches of STI in different areas.

In view of this, a method for manufacturing shallow trench isolations is urgently needed, which can solve the above problem that the trench depth/CD/HM remain loading is difficult to control due to the large difference in characteristic dimensions of devices in the storage cell area and the peripheral area, and solve the problem of dislocation defect of the shallow trench isolation in the peripheral area due to the stress effect, thereby ensuring the yield of the storage device.

BRIEF SUMMARY

A brief summary of one or more aspects is given below to provide basic understanding of these aspects. This summary is not a detailed overview of all conceived aspects, and is not intended to identify critical or decisive factors of all aspects or to try to define the scope of any or all aspects. The only purpose is to provide some concepts of one or more aspects in a simplified form so as to provide more detailed descriptions later.

As described above, in order to solve the problem that the trench depth/CD/HM remain loading is difficult to control due to the large difference in characteristic dimensions of devices in the storage cell area and the peripheral area, and the problem of dislocation defect of the shallow trench isolation in the peripheral area due to the stress effect, the present invention provides a method for manufacturing shallow trench isolations, specifically including:

providing a substrate, the substrate including a storage cell area and a peripheral area of a storage device;

etching the upper part of the substrate of the storage cell area using a first etching process to form a first shallow trench, and filling the first shallow trench with first silicon oxide using a first deposition process to form a first shallow trench isolation; and etching the upper part of the substrate of the peripheral area using a second etching process different from the first etching process to form a second shallow trench, and filling the second shallow trench with second silicon oxide using a second deposition process different from the first deposition process to form a second shallow trench isolation; wherein the depth of the first shallow trench is smaller than the depth of the second shallow trench, and the characteristic dimension of the first shallow trench is smaller than the characteristic dimension of the second shallow trench.

In an embodiment of the manufacturing method, optionally, the stress of the second silicon oxide is smaller than the stress of the first silicon oxide.

In an embodiment of the manufacturing method, optionally, the first deposition process forms the first silicon oxide by means of reaction of perhydro-polysilazane and vapor and a high-temperature annealing step; and the second deposition process forms the second silicon oxide by means of direction reaction of silane and oxygen.

In an embodiment of the manufacturing method, optionally, the working temperature of the high-temperature annealing step of the first deposition process is 500° C. to 800° C.; and the reaction temperature of the second deposition process is 300° C. to 500° C.

In an embodiment of the manufacturing method, optionally, the second deposition process is a high density plasma process.

In an embodiment of the manufacturing method, optionally, a gate dielectric layer and a floating gate layer are further sequentially formed on the upper surface of the substrate in the height direction of the substrate, and the step of forming the first shallow trench further includes:

etching the gate dielectric layer and the floating gate layer together to form a floating gate structure of each storage cell.

In an embodiment of the manufacturing method, optionally, the first etching process has the effect of lateral passivation protection on side surfaces of the floating gate structure and side spaces of the first shallow trench; and the second etching process does not have the effect of lateral passivation protection on side spaces of the second shallow trench.

In an embodiment of the manufacturing method, optionally, the first etching process controls the characteristic dimensions of the floating gate structure and the first shallow trench to be 20-30 nm.

In an embodiment of the manufacturing method, the characteristic dimension of the second shallow trench of a peripheral low voltage device formed by the second etching process is more than ten times the characteristic dimension of the first shallow trench; and/or, the characteristic dimension of the second shallow trench of a peripheral high voltage device formed by the second etching process is more than forty times the characteristic dimension of the first shallow trench.

In an embodiment of the manufacturing method, optionally, before the first etching process is used for etching, the manufacturing method further includes:

a step of patterning a mask layer using a self-aligning dual imaging process; wherein in the first etching process, the gate dielectric layer, the floating gate layer and the upper part of the substrate of the storage cell area is etched using the mask layer formed by the self-aligning dual imaging process.

In an embodiment of the manufacturing method, optionally, the first deposition process further includes:

forming first silicon oxide between the floating gate structures of the storage cells, wherein the first silicon oxide formed further covers the floating gate structures; and the second etching process further includes:

etching the upper part of the substrate in the peripheral area using the first silicon oxide as a hard mask layer of the storage cell area.

According to the method for manufacturing shallow trench isolations provided by the present invention, trenches in the storage cell area and the peripheral area are separately etched, which can specifically control the shape of the etched device by controlling the parameters of the etching processes to meet the process requirements. The shallow trenches in the storage cell area and the peripheral area are separately filled, which can specifically eliminate the dislocation defect by controlling the parameters of the etching processes to improve the yield of the device.

BRIEF DESCRIPTION OF THE DRAWINGS

The above features and advantages of the present invention can be better understood after reading detailed descriptions of the embodiments of the present disclosure in conjunction with the following drawings. In the drawings, each component is not necessarily drawn to scale, and components having similar related characteristics or features may have the same or similar reference numerals.

REFERENCE NUMERALS

Figure 1:
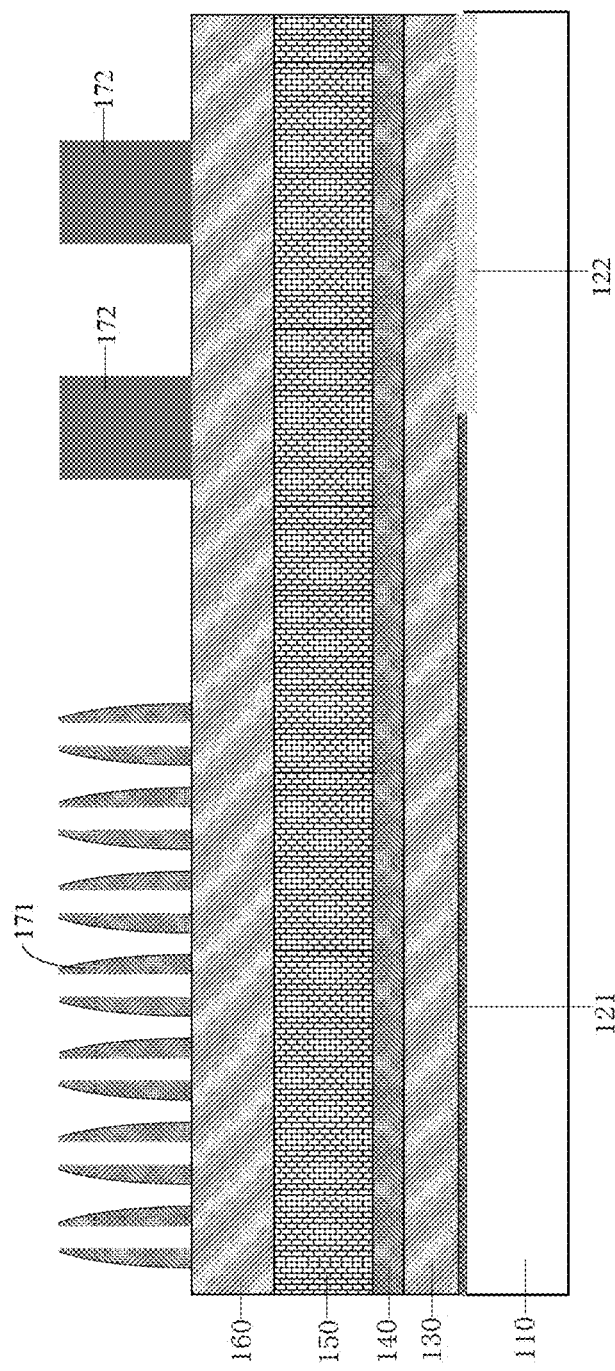
FIG. 1 shows a schematic diagram of various films and photolithographic side space patterns of a semiconductor structure that requires processing in the prior art.
Figure 2:
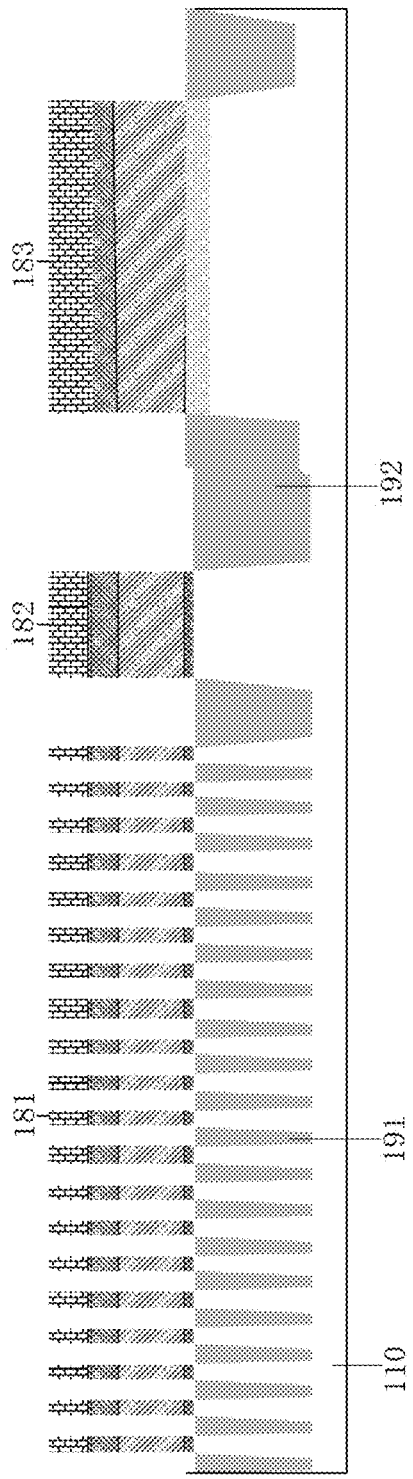
FIG. 2 shows a schematic structural diagram of a device after shallow trench isolations are formed in the prior art.

110 Substrate
121 Gate dielectric layer of low voltage device
122 Gate dielectric layer of high voltage device
130 Polysilicon
140 Silicon nitride
150 Oxide buffer layer
160 Amorphous silicon A-Si
171 Side space pattern
172 BARC/ODL
181 Storage cell floating gate structure
182 Peripheral low voltage device floating gate structure
183 Peripheral high voltage device floating gate structure
191 Storage cell area STI
192 Peripheral area STI
200 Substrate
310 Gate dielectric layer
320 Floating gate layer
330 Silicon nitride
340 Silicon oxide hard mask
350 Floating gate structure
400 Polysilicon hard mask
410 Side space pattern
510 Peripheral area photoresist
520 Storage area photoresist
610 First shallow trench
620 First silicon oxide
710 Second shallow trench
720 Second silicon oxide

DETAILED DESCRIPTION OF THE DISCLOSURE

The following description is provided so that those skilled in the art can implement and use the present invention and combine it into a specific application background. Various modifications, and various uses in different applications will be readily apparent to those skilled in the art, and the general principles defined herein can be applied to a wide range of embodiments. Thus, the present invention is not limited to the embodiments given herein, but should be granted in the broadest scope of the principles and novel features disclosed herein.

Many specific details are set forth in the following detailed description to provide a thorough understanding of the present invention. However, it would be apparent to those skilled in the art that the practice of the present invention is not necessarily limited to these specific details. In other words, the well-known structures and devices are shown in the form of block diagrams without details to avoid obscuring the present invention.

Readers should pay attention to all documents and literature that are simultaneously submitted with this description and are open to the public to consult this description, and all such documents and literature are incorporated herein by reference. All features disclosed in this description (including any of the appended claims, abstract, and drawings) can be substituted by alternative features for achieving the same, equivalent or similar purposes, unless otherwise directly stated. Therefore, each feature disclosed is only an example of a group of equivalent or similar features, unless otherwise specified.

It should be noted that, in the case of use, the signs left, right, front, rear, top, bottom, positive, reverse, clockwise and counterclockwise are only used for convenient purposes, but do not imply any specific direction. In fact, they are used to reflect the relative position and/or direction between individual parts of an object.

The present invention will be described in detail below with reference to the accompanying drawings and specific embodiments. It should be noted that all aspects described below with reference to the accompanying drawings and specific embodiments are merely exemplary, and should not be construed as any limitation to the protection scope of the present invention.

As described above, in the present application, the storage cell area, the peripheral high voltage device area and the Peripheral low voltage device area have differences in target parameters of multiple control objects, as shown in the following table:

| Control object | Storage cell area (Array) | Peripheral low voltage device area (LV) | Peripheral high voltage device area (HV) |
|---|---|---|---|
| Gate dielectric layer | 60 A+ | 60 A+ | 400 A+ |
| Characteristic dimension | 20 nm+ | >10:1 (LV:Array) | >40:1 (HV:Array) |
| Control on shape and characteristic dimension | Strict control | Loose control | |

Figure 3:
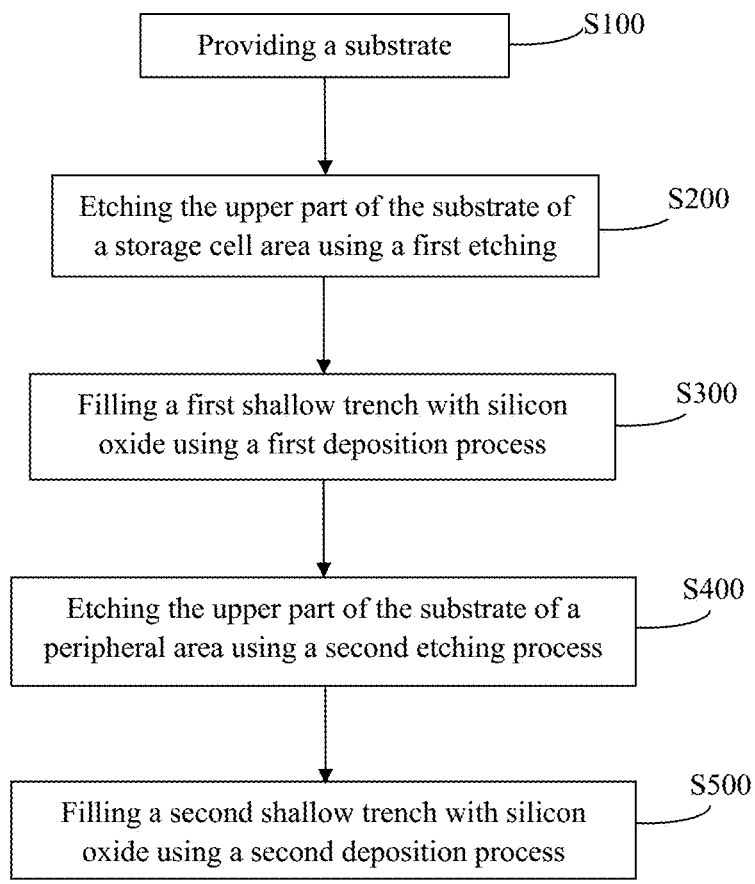
FIG. 3 shows a flowchart of an embodiment of a manufacturing method provided by the present invention.

In order to solve the problem that the trench depth/CD/HM remain loading is difficult to control due to the large difference in characteristic dimensions of devices in the storage cell area and the peripheral area, and the problem of dislocation defect of the shallow trench isolation in the peripheral area due to the stress effect, the present invention provides a method for manufacturing shallow trench isolations. The manufacturing method provided in one aspect of the present invention is interpreted in conjunction with FIG. 3. As shown in FIG. 3, the manufacturing method provided in one aspect of the present invention specifically includes: step S100: providing a substrate; step S200: etching the upper part of the substrate of a storage cell area using a first etching process; S300: filling a first shallow trench with silicon oxide using a first deposition process; step S400: etching the upper part of the substrate of a peripheral area using a second etching process; and step S500: filling a second shallow trench with silicon oxide using a second deposition process.

The first etching process is different from the second etching process, the first deposition process is different from the second deposition process, the depth of the first shallow trench is smaller than the depth of the second shallow trench, and the characteristic dimension of the first shallow trench is smaller than the characteristic dimension of the second shallow trench.

The manufacturing method of the present invention will be further interpreted in conjunction with FIGS. 4-12. FIGS. 4-12 show schematic structural diagrams of a semiconductor device in various steps of the manufacturing methods provided by the present invention.

Figure 4:
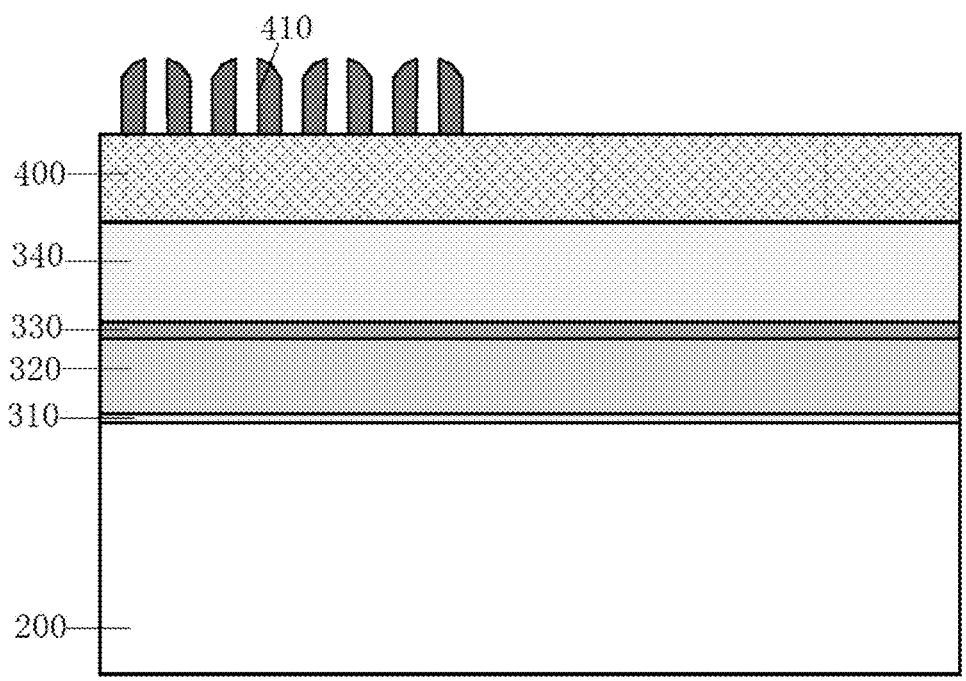
FIG. 4 shows a schematic diagram of various films and photolithographic side space patterns of a storage cell area of a semiconductor structure that requires processing by the manufacturing method according to the present invention.

First, please refer to FIG. 4, FIG. 4 shows a schematic diagram of photolithographic side space patterns of a storage cell area, and various films of a semiconductor structure that requires processing by the manufacturing method according to the present invention. As shown in FIG. 4, in step S100 of providing a substrate, the substrate 200, and a gate dielectric layer 310, a floating gate layer 320, silicon nitride 330, a silicon oxide hard mask 340, a polysilicon hard mask 400 and a side space pattern 410 sequentially formed from bottom to top above the substrate in the height direction of the substrate are provided. Understandably, the side space pattern 410 is formed based on a self-aligning dual imaging process.

Figure 5:
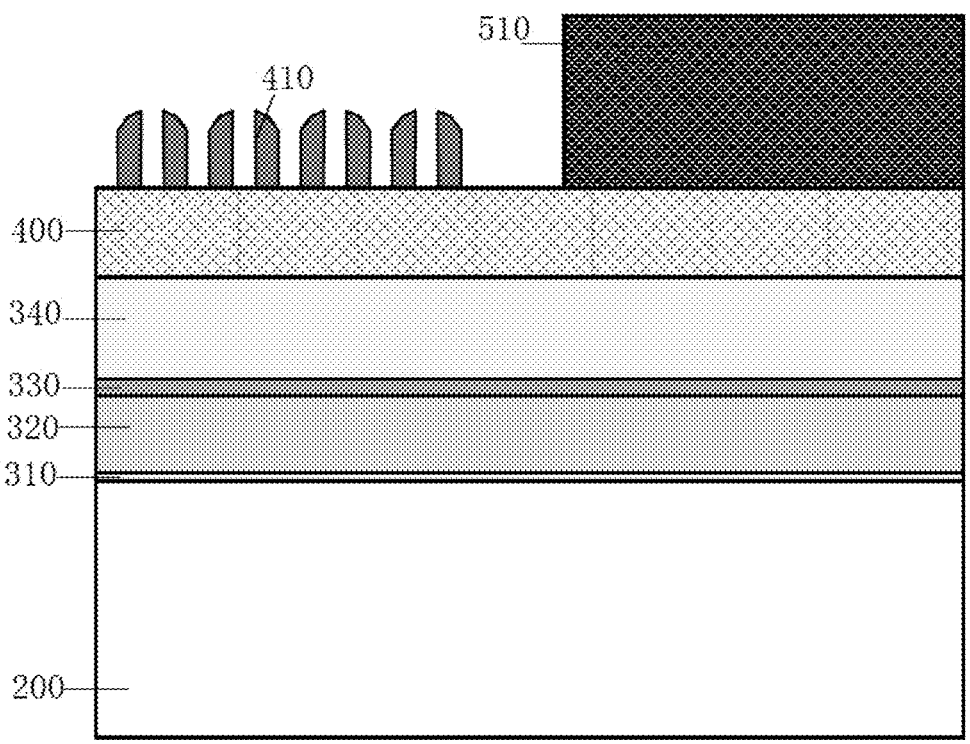
FIG. 5 shows a schematic diagram of a photoresist pattern of a peripheral area formed by the manufacturing method according to the present invention.

Then, as shown in FIG. 5, a photoresist pattern of the peripheral area, that is, a photoresist 510 of the peripheral area, is separately formed. Understandably, step S100 further includes defining a storage cell area and a peripheral area of a storage device. Here, the photoresist 510 of the peripheral area can protect the entire peripheral area defined. Thus, when the storage cell area is etched using the side space pattern 410, the peripheral area can be prevented from being etched.

Figure 6:
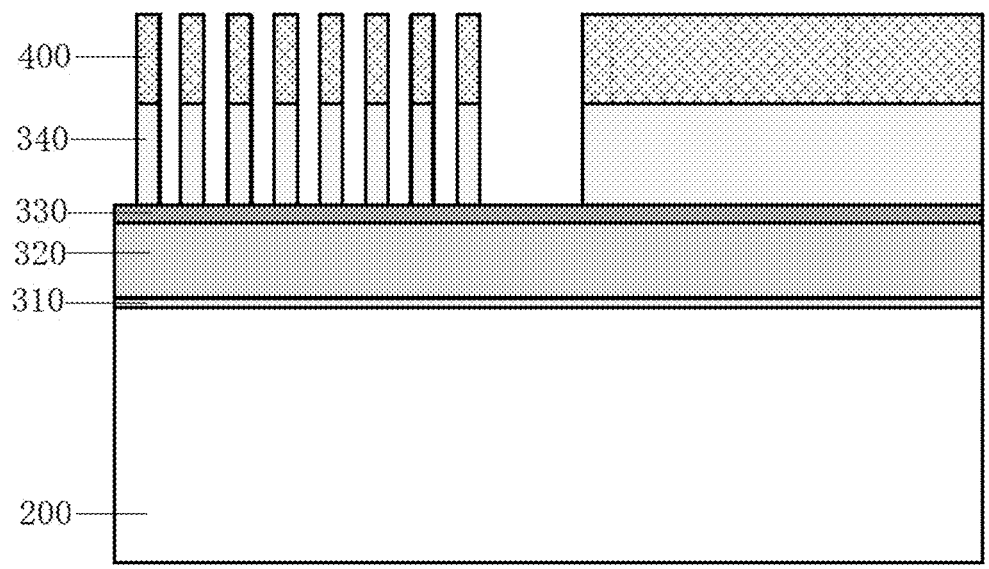
FIG. 6 shows a schematic structural diagram after the photolithographic side space patterns and the photoresist image in FIGS. 4 and 5 are transferred to a hard mask layer.

Since a floating gate structure and a shallow trench isolation etching pattern are defined using the self-aligning dual imaging process in the manufacturing method provided by the present invention, as shown in FIG. 6, the pattern of the side space pattern 410 is required to be transferred to the silicon oxide hard mask 340 and the polysilicon hard mask 400. Step S200 is performed by means of the patterned silicon oxide hard mask 340 and the polysilicon hard mask 400, to etch the substrate floating gate layer 320, the gate dielectric layer 310, and the upper part of the substrate of the storage cell area using the first etching process, as shown in FIG. 7.

Figure 7:
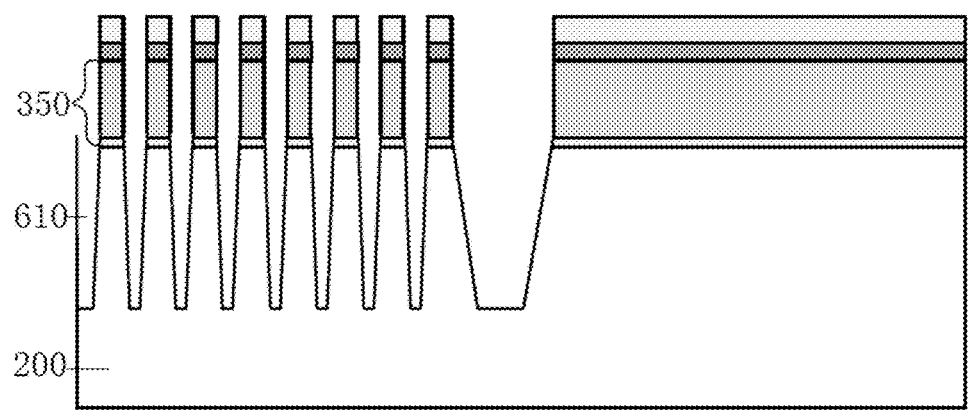
FIG. 7 shows a schematic structural diagram after a storage cell area is etched using the patterned hard mask layer in FIG. 6 to form a floating gate structure and a first shallow trench of a storage cell.

Referring to FIG. 7, floating gate structures 350 and first shallow trenches 610 of the storage cell area are formed. The floating gate structure 350 includes the floating gate layer 320 and the gate dielectric layer, and the silicon nitride 330 and the silicon oxide hard mask 340 remain after etching above the floating gate structure 350 as protective layers for the floating gate structure 350.

It can be known from FIG. 7 that in the manufacturing method provided by the present invention, the characteristic dimension of the floating gate structure 350 formed is very small, the characteristic dimension between the floating gate structures (that is, the first shallow trench 610) is also very small, and according to the process requirements, the characteristic dimensions of the floating gate structures 350 and the first shallow trenches 610 are between 20 and 30 nm, that is, the manufacturing method provided by the present invention manufactures a 2X generation storage device.

In the first etching process, the characteristic dimensions of the floating gate structures 350 and the first shallow trenches 610 need to be controlled, and because any protective layer is not provided on two sides of the floating gate structures, the shapes of the floating gate structures 350 also need to be strictly controlled during etching, especially during etching of the first shallow trenches. Therefore, in the first etching process, an etch base having the effect of lateral passivation protection on the top floating gate structures 350 is added, which can thus accurately control the shapes and characteristic dimensions of the floating gate structures and the first shallow trenches during the first etching process.

The etch base having the effect of lateral passivation protection indicates that the entire trench etching process adopts a circulating process of cleaning-passivation-etching, and passivation gas $N_2$ is introduced in the passivation step to form a side space passivation layer on the patterned bare portion, which can achieve a protection effect in the etching step to accurately control the line width and shape.

Figure 8:
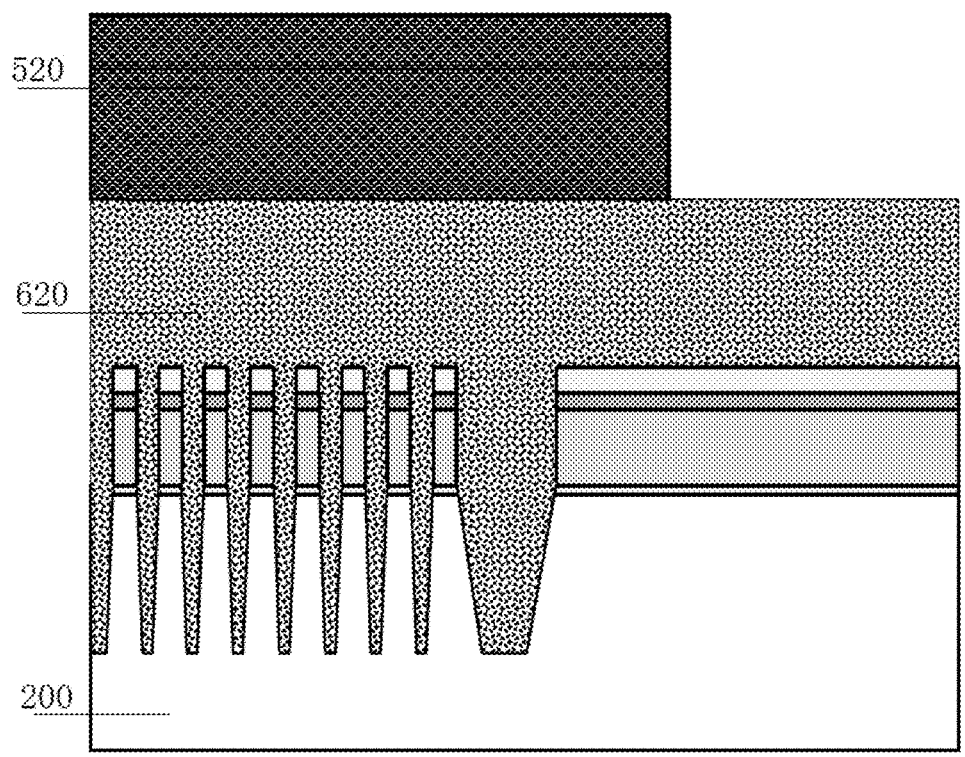
FIG. 8 shows a schematic structural diagram after first silicon oxide covering the floating gate structure and a photoresist pattern of the storage cell area are formed.

Referring to FIG. 8, step S300 is performed: first silicon oxide 620 that fills the first shallow trenches and gaps between the floating gate structures and covers the floating gate structures is formed using the first deposition process, and a photoresist pattern of the storage cell area, that is, a photoresist 520 of the storage area, is also formed.

In step S300, the first deposition process forms the first silicon oxide by means of reaction of perhydro-polysilazane and vapor and a high-temperature annealing step. Specifically, the reaction synthesis process is, O in Perhydro-Polysilazane (PSZ) is replaced with N using vapor as an oxygen source in an environment of about 300° C., and then $SiO_2$ is formed via an annealing process of 500° C. to 800° C. Because of the high-temperature annealing step, the $SiO_2$ formed is dense silicon oxide. After this step, the dense silicon oxide can be filled in the first shallow trench to form a shallow trench isolation (STI).

The photoresist 520 of the storage area can protect the entire storage cell area defined, so that the floating gate structure and STI formed can be prevented from being etched during subsequent etching of the peripheral area.

Figure 9:
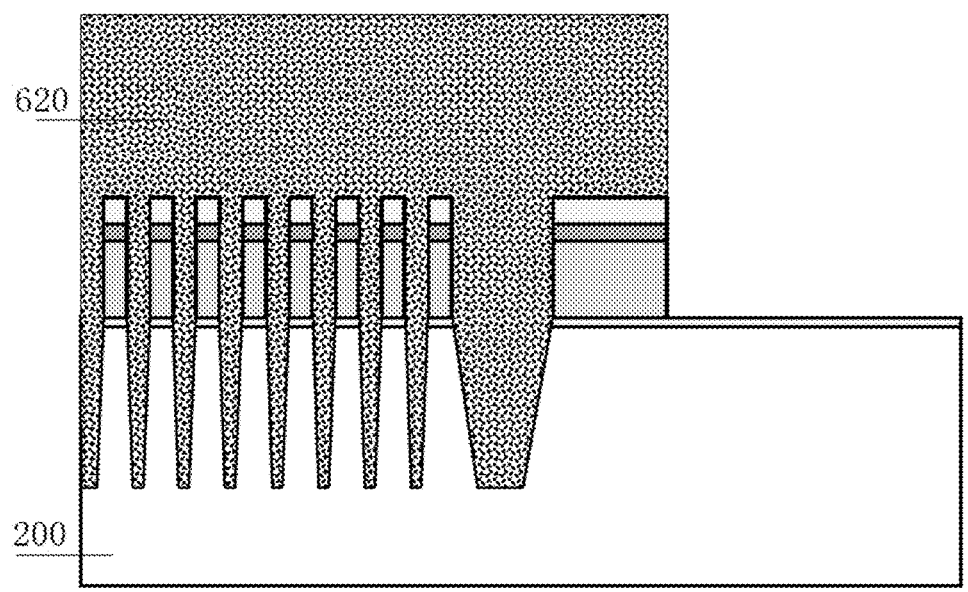
FIG. 9 shows a schematic structural diagram after the photoresist pattern of the storage cell area in FIG. 8 is transferred to the first silicon oxide layer.

Referring to FIG. 9, FIG. 9 shows a schematic structural diagram after the photoresist pattern of the storage cell area in FIG. 8 is transferred to the first silicon oxide layer. That is, in subsequent step S400, in the second etching process, the upper part of the substrate of the peripheral area is etched using the patterned first silicon oxide 620 as a hard mask layer of the storage cell area.

Figure 10:
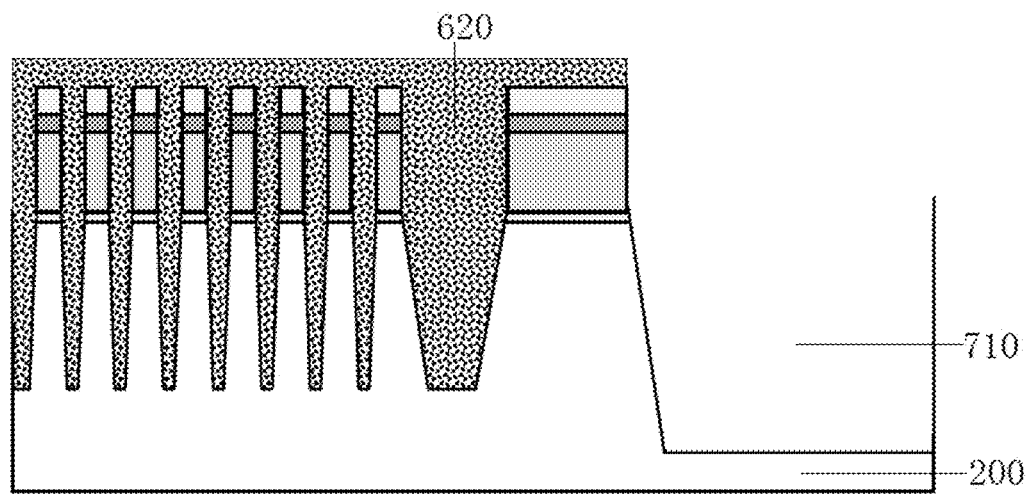
FIG. 10 shows a schematic structural diagram after a peripheral area is etched using the first silicon oxide layer in FIG. 9 as a hard mask layer to form a second shallow trench.

Subsequently, referring to FIG. 10, FIG. 10 shows a schematic structural diagram after the peripheral area is etched using the first silicon oxide layer in FIG. 9 as a hard mask layer to form second shallow trenches. That is, step S400 is performed: the second etching process is performed to form second shallow trenches 710.

Understandably, the second shallow trenches 710 actually include shallow trenches corresponding to low voltage devices and shallow trenches corresponding to high voltage devices. The characteristic dimension of the second shallow trench of a peripheral low voltage device formed by the second etching process is more than ten times the characteristic dimension of the first shallow trench, and the characteristic dimension of the second shallow trench of a peripheral high voltage device formed by the second etching process is more than forty times the characteristic dimension of the first shallow trench.

The first etching process and the second etching process are also different in the depths of the shallow trenches formed. Generally, the depth of the first shallow trench formed in the storage cell area is 2200 Å, and the depth of the second shallow trench formed in the peripheral area is 2700 Å. Thus, the etching parameters need to be separately controlled on process to achieve the target depths.

The second etching process does not have the effect of lateral passivation protection on the side space of the second shallow trench. As mentioned above, in the first etching process, the step of etching the first shallow trench is mainly based on silicon etching, and needs to protect the floating gate structure whose upper layer has been patterned, so the etch base that achieves the effect of lateral passivation protection on the top floating gate structure is added in the first etching process. This lateral passivation protection will affect the shape of the side space of the shallow trench at the same time. Since the characteristic dimension of the first shallow trench in the storage cell area is very small, the lateral passivation protection on the floating gate structure is greater than the extent to which the shape of the side space of the shallow trench is affected. However, since the characteristic dimension of the second shallow trench in the peripheral area is large, the lateral passivation protection will form a non-smooth stepped shape on the side space of the second shallow trench in the peripheral area. This needs to be overcome. Since the manufacturing method provided by the present invention separately treats the etching of the shallow trench in the storage cell area and the etching of the shallow trench of the peripheral area, the floating gate structure with small characteristic dimension at the top of the storage cell area does not need to be considered. Therefore, the lateral passivation protection can be canceled in the second etching process.

Understandably, in the first etching process, the entire trench etching process adopts a circulating process of cleaning-passivation-etching, and passivation gas $N_2$ is introduced in the passivation step to form a side space passivation layer on the patterned bare portion, which can achieve a protection effect in the etching step.

In the second etching process, because the characteristic dimension is relatively large, the passivation step is not required to accurately control the characteristic dimension and shape, and the etching process only needs to meet depth requirements.

Figure 11:
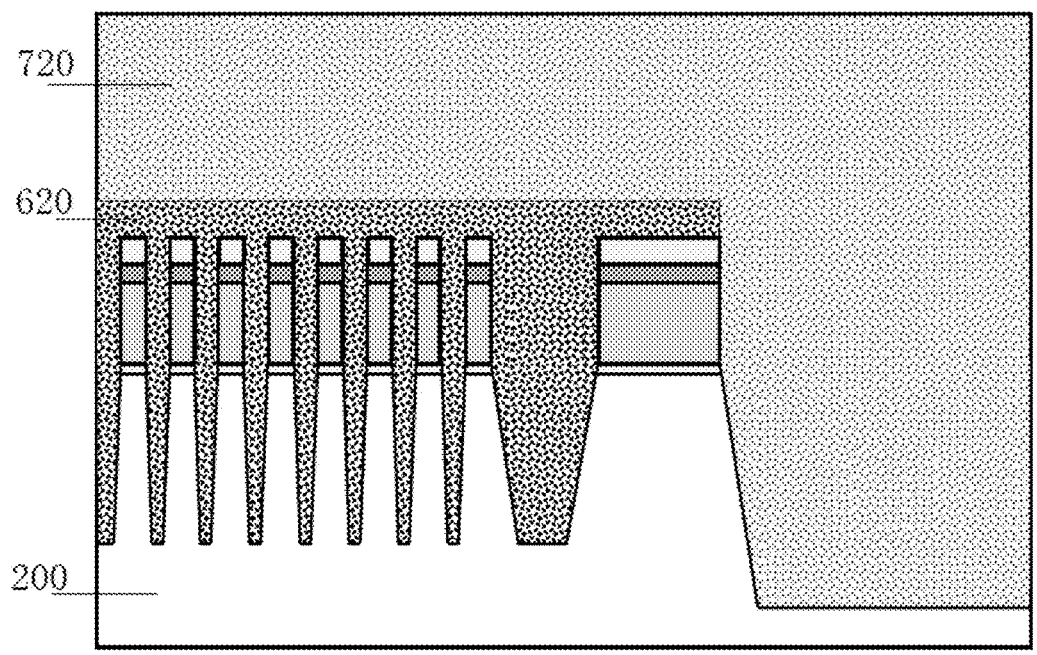
FIG. 11 shows a schematic structural diagram after the second shallow trench is filled with second silicon oxide.

Subsequently, as shown in FIG. 11, step S500 is performed: the second shallow trench 710 is filled with second silicon oxide 720 using the second deposition process to form a shallow trench isolation in the peripheral area. The second deposition process is a high density plasma (HDP) process. This process adds Bias RF based on PECVD, and introduces the effect of sputter during deposition, thereby controlling the size of overhang to reduce the deposition rate of the side space of the trench and then to realize filling. The HDP oxide formed by the second deposition process is obtained by the reaction of silane and oxygen at the temperature of 300° C. to 500° C., which is a low-temperature deposition reaction. Compared to the high-temperature annealing in the first deposition process, the silicon oxide stress of the HDP oxide deposited at low temperature in the large peripheral area is attenuated. Therefore, the defect of silicon dislocation in the prior art can be avoided.

Figure 12:
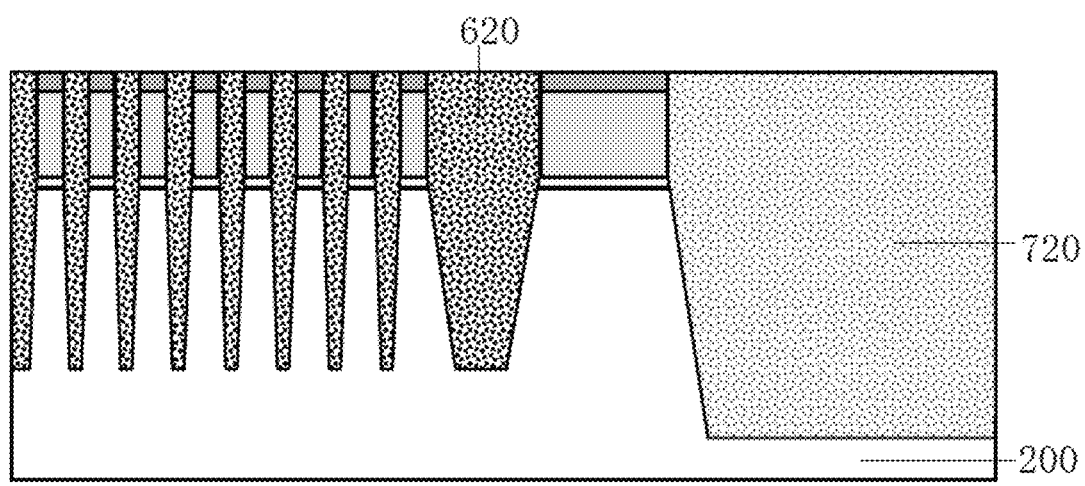
FIG. 12 shows a schematic structural diagram after planarization for the entire wafer.

Subsequently, as shown in FIG. 12, the entire wafer on which the shallow trench isolations and the floating gate structures in the storage cell area, and the shallow trench isolation in the peripheral area are formed is flattened to remove redundant second silicon oxide, first silicon oxide and silicon oxide hard mask as a protective layer for the floating gate structures.

So far, the method for manufacturing shallow trench isolations according to the present invention is already described. The storage cell area and the peripheral area are separately etched, so that the characteristic dimension, shape, and trench etching depth of the storage cell area itself are controlled more accurately. The shallow trenches in the storage cell area and the peripheral area are separately filled to form shallow trench isolations, which can effectively solve the stress dislocation defect in the peripheral area. According to the present invention, the yield of the storage device can be effectively improved.

So far, the embodiments of the method for manufacturing shallow trench isolations according to the present invention are already described. Although the present disclosure is described with respect to specific exemplary embodiments, it would be apparent that various modifications and changes can be made to these embodiments without departing from the broader spirit and scope of the present disclosure. Therefore, this description and the accompanying drawings are considered to be illustrative but not restrictive.

It should be understood that this description would not be used to explain or limit the scope or significance of the claims. Moreover, in the foregoing detailed description, it can be seen that various features are combined together in a single embodiment for the purpose of simplifying the present disclosure. The method of the present disclosure should not be construed as reflecting the claimed embodiments require more features than those specifically listed in each claim. Conversely, as reflected in the appended claims, the creative subject matters are fewer than all features of a single embodiment disclosed. Accordingly, the appended claims are hereby incorporated in detailed descriptions, and each claim serves as an individual embodiment.

One embodiment or embodiments mentioned in this description are intended to be included in at least one embodiment of a circuit or method in conjunction with the specific features, structures, or characteristics described in the embodiment(s). The phrase "an embodiment" that appears everywhere in the description does not necessarily refer to the same embodiment.

What is claimed is:

1. A method for manufacturing shallow trench isolations, comprising:
   providing a substrate, the substrate comprising a storage cell area and a peripheral area of a storage device, wherein a gate dielectric layer and a floating gate layer are further sequentially formed on an upper surface of the substrate in a height direction of the substrate;
   etching an upper part of the substrate of the storage cell area using a first etching process to form a first shallow trench, etching the gate dielectric layer and the floating gate layer together to form a floating gate structure of each storage cell, filling the first shallow trench with a first silicon oxide using a first deposition process to form a first shallow trench isolation, and forming the first silicon oxide between the floating gate structures of the storage cells, wherein the formed first silicon oxide further covers the floating gate structures; and etching an upper part of the substrate of the peripheral area using a second etching process different from the first etching process to form a second shallow trench, and filling the second shallow trench with second silicon oxide using a second deposition process different from the first deposition process to form a second shallow trench isolation, wherein a depth of the first shallow trench is smaller than a depth of the second shallow trench, and a characteristic dimension of the first shallow trench is smaller than a characteristic dimension of the second shallow trench, and wherein the second etching process further comprises:
etching the upper part of the substrate in the peripheral area using the first silicon oxide as a hard mask later of the storage cell area.

2. The method for manufacturing according to claim 1, wherein a stress of the second silicon oxide is smaller than a stress of the first silicon oxide.

3. The method for manufacturing according to claim 1, wherein the first deposition process forms the first silicon oxide by means of a reaction of perhydro-polysilazane and vapor and a high-temperature annealing step; and the second deposition process forms the second silicon oxide by means of a direction reaction of silane and oxygen.

4. The method for manufacturing according to claim 3, wherein a working temperature of the high-temperature annealing step of the first deposition process is 500° C. to 800° C.; and a reaction temperature of the second deposition process is 300° C. to 500° C.

5. The method for manufacturing according to claim 3, wherein the second deposition process is a high density plasma process.

6. The method for manufacturing according to claim 1, wherein the first etching process has an effect of lateral passivation protection on side surfaces of the floating gate structure and side spaces of the first shallow trench; and the second etching process does not have an effect of lateral passivation protection on side spaces of the second shallow trench.

7. The method for manufacturing according to claim 6, wherein the first etching process controls characteristic dimensions of the floating gate structure and the first shallow trench to be 20-30 nm.

8. The method for manufacturing according to claim 7, wherein the characteristic dimension of the second shallow trench of a peripheral low voltage device formed by the second etching process is more than ten times the characteristic dimension of the first shallow trench; and/or, the characteristic dimension of the second shallow trench of a peripheral high voltage device formed by the second etching process is more than forty times the characteristic dimension of the first shallow trench.

9. The method for manufacturing according to claim 7, wherein before the first etching process is used for etching, the method for manufacturing further comprises:

a step of patterning a mask layer using a self-aligning dual imaging process, wherein, in the first etching process, the upper part of the substrate of the gate dielectric layer, the floating gate layer, and the storage cell area are etched using the mask layer formed by the self-aligning dual imaging process.

* * * * *